United States Patent
Hong et al.

(10) Patent No.: US 11,362,373 B2
(45) Date of Patent: Jun. 14, 2022

(54) METHOD FOR REGENERATING LITHIUM SECONDARY BATTERY

(71) Applicant: LG Chem, Ltd., Seoul (KR)

(72) Inventors: Chul Gi Hong, Daejeon (KR); Jae Hyun Lee, Daejeon (KR); Seok Koo Kim, Daejeon (KR); Dong Kyu Kim, Daejeon (KR); Dae Soo Kim, Daejeon (KR)

(73) Assignee: LG Energy Solution, Ltd.

( * ) Notice: Subject to any disclaimer, the term of this patent is extended or adjusted under 35 U.S.C. 154(b) by 338 days.

(21) Appl. No.: 16/497,235

(22) PCT Filed: Jul. 10, 2018

(86) PCT No.: PCT/KR2018/007825
§ 371 (c)(1),
(2) Date: Sep. 24, 2019

(87) PCT Pub. No.: WO2019/013536
PCT Pub. Date: Jan. 17, 2019

(65) Prior Publication Data
US 2020/0295410 A1    Sep. 17, 2020

(30) Foreign Application Priority Data

Jul. 10, 2017 (KR) .................. 10-2017-0087274
Jul. 9, 2018 (KR) .................. 10-2018-0079493

(51) Int. Cl.
*H01M 10/42*  (2006.01)
*G01R 31/389*  (2019.01)
(Continued)

(52) U.S. Cl.
CPC ...... *H01M 10/4242* (2013.01); *G01R 31/389* (2019.01); *G01R 31/392* (2019.01); *H01M 4/382* (2013.01); *H01M 10/052* (2013.01)

(58) Field of Classification Search
CPC . G01R 31/389; G01R 31/392; H01M 10/052; H01M 10/4242; H01M 10/44; H01M 4/382; Y02E 60/10; Y02P 70/50
See application file for complete search history.

(56) References Cited

U.S. PATENT DOCUMENTS

| 2008/0050644 A1 | 2/2008 | Christensen et al. |
| 2014/0028264 A1 | 1/2014 | Taniyama et al. |

(Continued)

FOREIGN PATENT DOCUMENTS

| CN | 106684458 A | 5/2017 |
| JP | H08190934 A | 7/1996 |

(Continued)

OTHER PUBLICATIONS

Search report from International Application No. PCT/KR2018/007825, dated Oct. 12, 2018.

(Continued)

*Primary Examiner* — Victoria H Lynch
(74) *Attorney, Agent, or Firm* — Lerner, David, Littenberg, Krumholz & Mentlik, LLP

(57) ABSTRACT

A method for regenerating a lithium secondary battery including a lithium resupply step in which a lithium resupply electrode is provided in the secondary battery, and the positive electrode is set as a counter electrode, and the lithium resupply electrode is set as a working electrode to charge lithium ions to the positive electrode through the lithium resupply electrode and a negative electrode discharging step in which, after the lithium ions are resupplied to the positive electrode through the lithium resupply step, the lithium resupply electrode is set as the counter electrode, and the negative electrode is set as the working electrode to completely discharge the negative electrode up to a discharge limit.

14 Claims, 7 Drawing Sheets

(51) Int. Cl.
*G01R 31/392* (2019.01)
*H01M 4/38* (2006.01)
*H01M 10/052* (2010.01)

(56) References Cited

U.S. PATENT DOCUMENTS

2016/0294017 A1 10/2016 Ebisuzaki et al.
2017/0149099 A1 5/2017 Takahashi

FOREIGN PATENT DOCUMENTS

| | | | |
|---|---|---|---|
| JP | 2002324585 A | 11/2002 | |
| JP | 2003070169 A | 3/2003 | |
| JP | 2009543294 A | 12/2009 | |
| JP | 2013045507 A | 3/2013 | |
| JP | 2015144070 A | 8/2015 | |
| JP | 2016076358 A | 5/2016 | |
| JP | 2016091613 A | 5/2016 | |
| JP | 2016119249 A | 6/2016 | |
| JP | 2017037734 A | 2/2017 | |
| JP | 2017045621 A | 3/2017 | |
| JP | 2017117637 A | 6/2017 | |
| KR | 20120035242 A | 4/2012 | |
| KR | 101510981 B1 | 4/2015 | |
| KR | 20160010121 A | 1/2016 | |
| KR | 20160117246 A | 10/2016 | |

OTHER PUBLICATIONS

Extended European Search Report including Written Opinion for Application No. EP18831588.1, dated Apr. 28, 2020, pp. 1-5.

METHOD FOR REGENERATING LITHIUM SECONDARY BATTERY

CROSS-REFERENCE TO RELATED APPLICATION

The present application is a national phase entry under 35 U.S.C. § 371 of International Application No. PCT/KR2018/007825 filed on Jul. 10, 2018, which claims the priority of Korean Patent Application Nos. 10-2017-0087274, filed on Jul. 10, 2017, and 10-2018-0079493, filed on Jul. 9, 2018, which are hereby incorporated by reference in their entirety.

TECHNICAL FIELD

The present invention relates to a method for regenerating a lithium secondary battery.

BACKGROUND ART

Secondary batteries are rechargeable unlike primarily batteries, and also, the possibility of compact size and high capacity is high. Thus, recently, many studies on secondary batteries are being carried out. As technology development and demands for mobile devices increase, the demands for secondary batteries as energy sources are rapidly increasing.

Secondary batteries are classified into coin type batteries, cylindrical type batteries, prismatic type batteries, and pouch type batteries according to a shape of a battery case. In such a secondary battery, an electrode assembly mounted in a battery case is a chargeable and dischargeable power generating device having a structure in which an electrode and a separator are stacked.

The electrode assembly may be approximately classified into a jelly-roll type electrode assembly in which a separator is interposed between a positive electrode and a negative electrode, each of which is provided as the form of a sheet coated with an active material, and then, the positive electrode, the separator, and the negative electrode are wound, a stacked type electrode assembly in which a plurality of positive and negative electrodes with a separator therebetween are sequentially stacked, and a stack/folding type electrode assembly in which stacked type unit cells are wound together with a separation film having a long length.

The existing lithium secondary battery gradually decreases in amount of lithium source by repeating a charging process, in which lithium ions moves from a positive electrode to a negative electrode, and a discharging process, in which the lithium ions moves from the negative electrode to the positive electrode. Thus, the battery may be reduced in capacity to be degraded. At present, methods for regenerating and reusing the degraded lithium secondary batteries are being studied.

DISCLOSURE OF THE INVENTION

Technical Problem

One aspect of the present invention is to provide a method for regenerating a lithium secondary battery, which is capable of improving lifetime characteristics of the lithium secondary battery.

Also, another aspect of the present invention is to provide a method for regenerating a lithium secondary battery, in which lithium ions are resupplied to a positive electrode through a lithium resupply electrode without disassembling the secondary battery to recovery a battery capacity.

Furthermore, further another aspect of the present invention is to provide a method for regenerating a lithium secondary battery, in which a negative electrode is completely discharged up to a discharge limit through a lithium resupply electrode without disassembling the secondary battery to improve recovery of a battery capacity.

Also, further another aspect of the present invention is to provide a method for regenerating a lithium secondary battery, which is capable of adjusting a balance between a positive electrode and a negative electrode.

Technical Solution

A method for regenerating a lithium secondary batter according to an embodiment of the present invention, which comprises an electrode assembly, in which electrodes comprising a positive electrode and a negative electrode and a separator are alternately combined with each other and laminated, and a battery case comprising an accommodation part accommodating the electrode assembly, comprises a lithium resupply step in which a lithium resupply electrode is further provided in the secondary battery, and the positive electrode is set as a counter electrode, and the lithium resupply electrode is set as a working electrode to charge lithium ions to the positive electrode through the lithium resupply electrode and a negative electrode discharging step in which, after the lithium ions are resupplied to the positive electrode through the lithium resupply step, the lithium resupply electrode is set as the counter electrode, and the negative electrode is set as the working electrode to completely discharge the negative electrode up to a discharge limit, wherein the secondary battery is recovered in capacity.

Advantageous Effects

According to the present invention, the lithium resupply electrode may be further provided in the secondary battery to resupply the lithium ions to the positive electrode without disassembling the secondary battery, thereby recovering the battery capacity.

Furthermore, according to the present invention, the negative electrode may be completely discharged up to the discharge limit through the lithium resupply electrode without disassembling the secondary battery to improve the recovery of the battery capacity. That is, when the lithium ions moves from the negative electrode to the positive electrode so as to be discharged, the lithium ions may remain in the negative electrode and thus may not be completely discharged. However, the lithium resupply electrode may be set as the counter electrode, and the negative electrode may be set as the working electrode to completely discharge the negative electrode up to the discharge limit while the lithium ions move from the negative electrode to the lithium resupply electrode.

Also, according to the present invention, the amount of lithium ions to be resupplied to the positive electrode and the amount of negative electrode to be discharged may be adjusted through the lithium resupply electrode to adjust the balance between the positive electrode and the negative electrode, thereby more significantly recovering the battery capacity.

MODE FOR CARRYING OUT THE INVENTION

Figure 1:
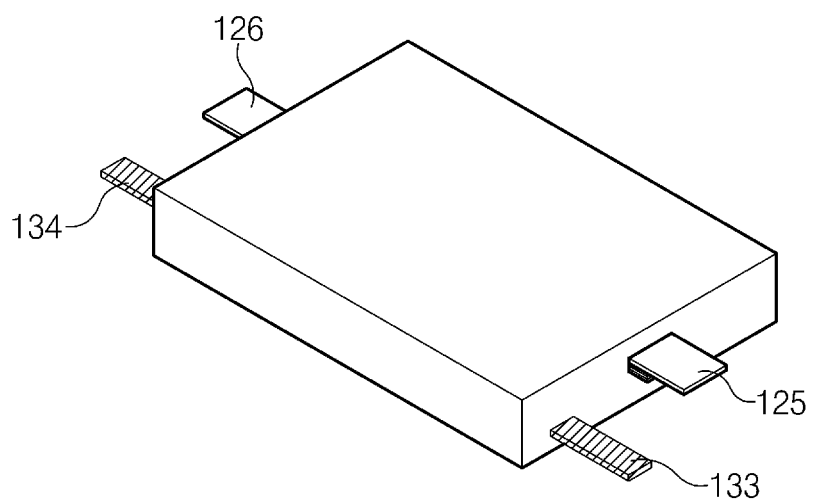
FIG. 1 is a perspective view of a lithium secondary battery applied to a method for regenerating the lithium secondary battery according to an embodiment of the present invention.

The objectives, specific advantages, and novel features of the present invention will become more apparent from the following detailed description taken in conjunction with the accompanying drawings. It should be noted that the reference numerals are added to the components of the drawings in the present specification with the same numerals as possible, even if they are illustrated in other drawings. Also, the present invention may be embodied in different forms and should not be construed as limited to the embodiments set forth herein. In the following description of the present invention, the detailed descriptions of related arts which may unnecessarily obscure the gist of the present invention will be omitted.

Figure 2:
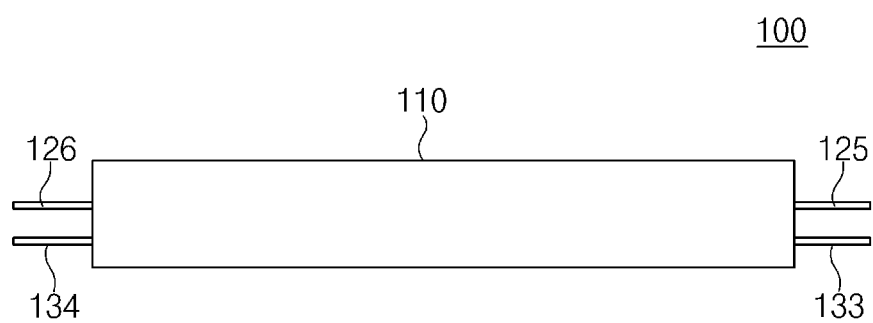
FIG. 2 is a front view of the lithium secondary battery applied to the method for regenerating the lithium secondary battery according to an embodiment of the present invention.
Figure 3:
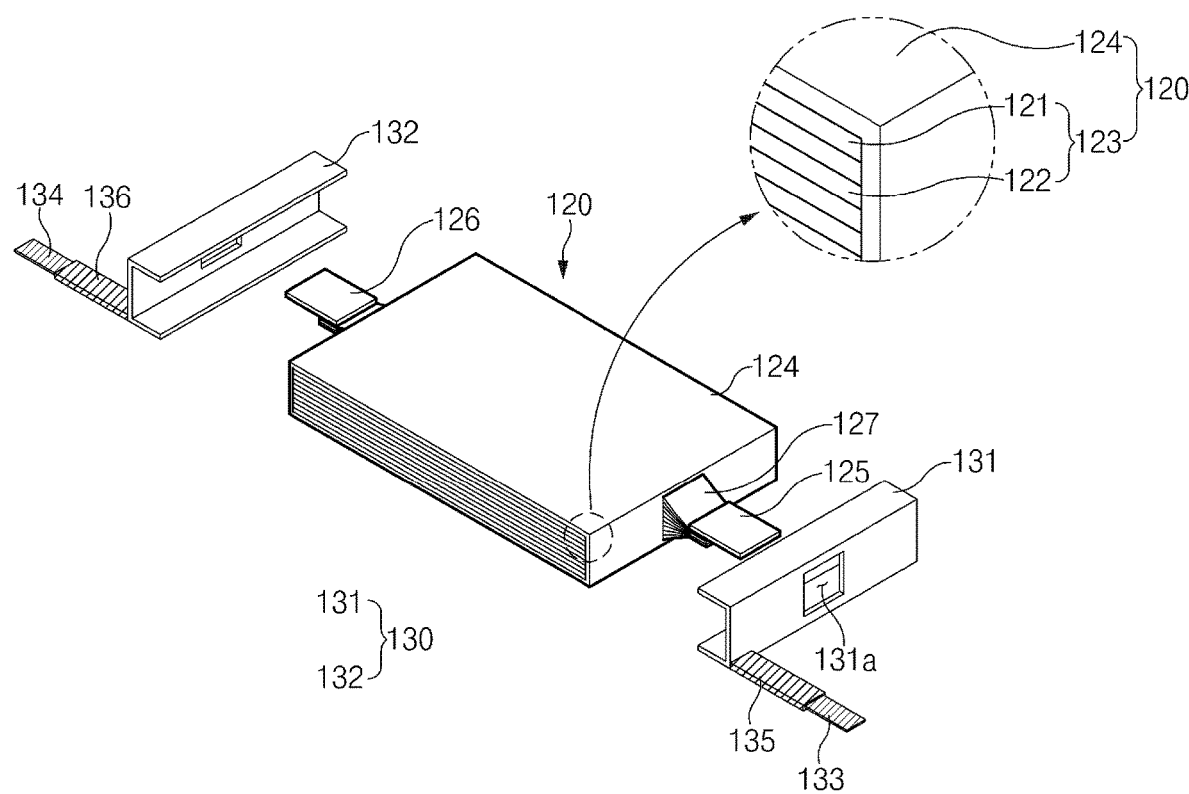
FIG. 3 is an exploded perspective view of an electrode assembly and a lithium resupply electrode in the lithium secondary battery applied to the method for regenerating the lithium secondary battery according to an embodiment of the present invention.

FIG. 1 is a perspective view of a lithium secondary battery applied to a method for regenerating the lithium secondary battery according to an embodiment of the present invention, FIG. 2 is a front view of the lithium secondary battery applied to the method for regenerating the lithium secondary battery according to an embodiment of the present invention, and FIG. 3 is an exploded perspective view of an electrode assembly and a lithium resupply electrode in the lithium secondary battery applied to the method for regenerating the lithium secondary battery according to an embodiment of the present invention.

Referring to FIGS. 1 to 3, a method for regenerating a lithium secondary battery according to an embodiment of the present invention comprises a lithium resupply step of charging lithium ions to a positive electrode 121 through a lithium resupply electrode 130 and a negative electrode discharging step of completely discharging a negative electrode 122 up to a discharge limit through the lithium resupply electrode 130 to recover a capacity of the secondary battery 100. Also, the method for regenerating the lithium secondary battery according to an embodiment of the present invention may further comprise a discharging step of discharging an electrode 123 before the lithium resupply step, a determination step of determining a degree of degradation of each of the positive electrode 121 and the negative electrode 122, and a balance reestablishment step of reestablishing a balance of the electrode 123.

Figure 4:
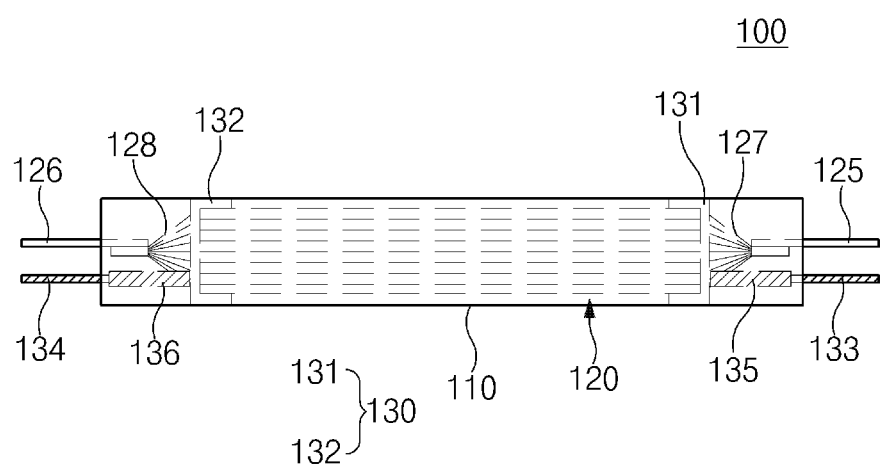
FIG. 4 is a front projective view illustrating an example of the lithium secondary battery applied to the method for regenerating the lithium secondary battery according to an embodiment of the present invention.
Figure 5:
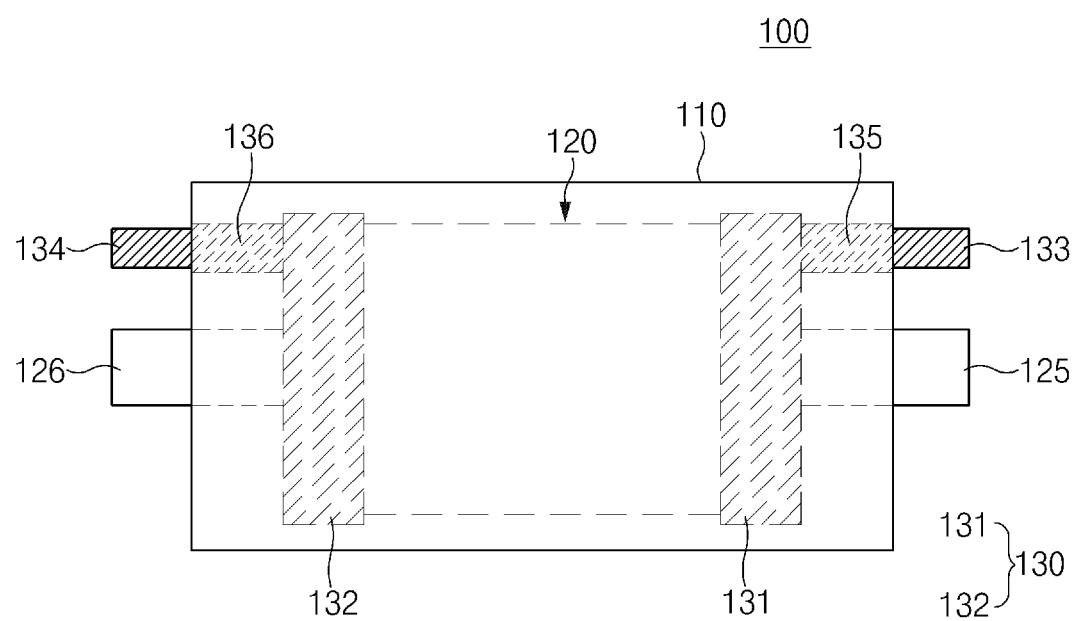
FIG. 5 is a bottom projective view illustrating an example of the lithium secondary battery applied to the method for regenerating the lithium secondary battery according to an embodiment of the present invention.

FIG. 4 is a front projective view illustrating an example of the lithium secondary battery applied to the method for regenerating the lithium secondary battery according to an embodiment of the present invention, and FIG. 5 is a bottom projective view illustrating an example of the lithium secondary battery applied to the method for regenerating the lithium secondary battery according to an embodiment of the present invention.

Hereinafter, the method for regenerating the lithium secondary battery according to an embodiment of the present invention will be described in more detail with reference to FIGS. 1 to 6.

Referring to FIGS. 3 and 4, the secondary battery 100 applied to the method for regenerating the lithium secondary battery according to an embodiment of the present invention comprises an electrode assembly 120 and a battery case 110 comprising an accommodation part accommodating the electrode assembly 120. Here, the secondary battery 100 applied to the method for regenerating the lithium secondary battery according to an embodiment of the present invention may further comprise an electrolyte and a lithium resupply electrode 130, which are accommodated in the battery case 110.

The electrode assembly 120 may be a chargeable and dischargeable power generation element and have a structure in which an electrode 123 and a separator 124 are combined and alternately stacked. Also, the electrode assembly 120 may comprise electrode leads 125 and 126 electrically connected to the electrode 123. Here, the electrode assembly 120 may further comprise electrode tabs 127 and 128 protruding from a side surface of the electrode 123 so as to be electrically connected to the electrode leads 125 and 126.

The electrode 123 may comprise a positive electrode 121 and a negative electrode 122. Here, the electrode assembly 120 may have a structure in which the positive electrode 121/the separator 124/the negative electrode 122 are alternately stacked.

The positive electrode 121 may comprise a positive electrode collector (not shown) and a positive electrode active material (not shown) applied to the positive electrode collector, and the negative electrode 122 may comprise a negative electrode collector (not shown) and a negative electrode active material (not shown) applied to the negative electrode collector.

For example, the positive electrode collector may be provided as foil made of an aluminum (Al) material.

The positive electrode active material may comprise lithium manganese oxide, lithium cobalt oxide, lithium nickel oxide, lithium iron phosphate, or a compound containing at least one of these or mixtures thereof.

For another example, the positive electrode active material may comprise a Hi Ni-based positive electrode material. Here, the Hi Ni-based positive electrode material may comprise one or more of a LiNiMnCoO-based material, a LiNiCoAl-based material, and a LiMiMnCoAl-based material.

For example, the negative electrode collector may be provided as foil made of a copper (Cu) or nickel (Ni) material.

For example, the negative electrode active material may be made of a material comprising synthetic graphite.

For another example, the negative electrode active material may comprise a lithium metal, a lithium alloy, carbon, petroleum coke, activated carbon, graphite, a silicon compound, a tin compound, a titanium compound, or an alloy thereof.

The separator 124 is made of an insulation material to electrically insulate the positive electrode 121 from the negative electrode 122. Here, the separator 124 may be disposed between the positive electrode 121 and the negative electrode 122 and also disposed on outer surfaces of the positive electrode 121 and outside the negative electrode 122. Here, the outermost side of the separator 124 may have a shape surrounding the electrode assembly 120 so as to be disposed between the lithium resupply electrode 130, the positive electrode 121, and the negative electrode 122.

Also, the separator 124 may be made of, for example, a polyolefin-based resin film such as polyethylene or polypropylene having micropores.

The electrode leads 125 and 126 may comprise a positive electrode lead 125 electrically connected to the positive electrode 121 and a negative electrode lead 126 electrically connected to the negative electrode 122.

The electrode tabs 127 and 128 may comprise a positive electrode tab 127 protruding from a side surface of the positive electrode 121 so as to be electrically connected to the positive electrode lead 125 and a negative electrode tab 128 protruding from a side surface of the negative electrode 122 so as to be electrically connected to the negative electrode lead 126.

For example, the electrolyte may comprise a non-aqueous electrolyte and a lithium salt as a non-aqueous electrolyte containing lithium.

For example, the non-aqueous electrolyte may comprise an aprotic organic solvent such as N-methyl-2-pyrrolidone, propylene carbonate, ethylene carbonate, butylene carbonate, dimethyl carbonate, diethyle carbonate, gamma-butyrolacton, 1,2-dimethoxy ethane, tetrahydroxy franc, 2-methyl tetrahydrofuran, dimethyl sulfoxide, 1,3-dioxolane, formamide, dimethyl formamide, dioxolane, acetonitrile, nitromethane, methyl formate, methyl acetate, phosphoric acid tri-ester, trimethoxy methane, dioxolane derivatives, sulfolan, methyl sulfolan, 1,3-dimethyl-2-imidazolidinone, a propylene carbonate derivative, a tetrahydrofuran derivative, ether, methyl propionate, and ethyl propionate.

Here, the lithium salt is easily dissolved in the non-aqueous electrolyte. For example, the lithium salt may comprise LiCl, LiBr, LiI, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $CF_3SO_3Li$, $(CF_3SO_2)_2NLi$, chloroborane lithium, lower aliphatic carboxylic acid lithium, 4phenyl lithium borate, or an imide.

Referring to FIGS. 3 to 5, the lithium resupply electrode 130 may be provided in plurality and accommodated in the battery case 110. Here, the lithium resupply electrode 130 may comprise a first lithium resupply electrode 131 disposed at one side of the electrode assembly 120 and a second lithium resupply electrode 132 disposed at the other side of the electrode assembly 120. Here, the electrode assembly 120 may be disposed in the accommodation part of the battery case 110, and the first lithium resupply electrode 131 and the second lithium resupply electrode 132 may be respectively disposed in the accommodation spaces that are defined in both sides of the electrode assembly 120.

Also, lithium resupply electrode leads 133 and 134 electrically connected to the lithium resupply electrode 130 may be further provided.

Furthermore, the lithium resupply electrode 130 may be made of, for example, a lithium metal.

The plurality of lithium resupply electrodes 130 may be disposed to respectively surround both ends of the electrode assembly 120. Here, the lithium resupply electrode 130 may have, for example, a "⊏" shape. Here, a through-hole 131a through which an electrode tab passes may be defined in the lithium resupply electrode 130.

Also, lithium resupply electrode tabs 135 and 136 protruding from a side surface of the lithium resupply electrode 130 may be further provided. Here, the lithium resupply electrode tabs 135 and 136 may be electrically connected to the lithium resupply electrode leads 133 and 134. For example, each of the lithium resupply electrode tabs 135 and 136 may be made of a lithium metal, and each of the lithium resupply electrode leads 133 and 134 may be made of an aluminum material.

Also, the lithium resupply electrode tabs 135 and 136 and the lithium resupply electrode leads 133 and 134 may be fixed to each other through welding.

Also, the lithium resupply electrode 130 and the lithium resupply electrode tabs 135 and 136 may be accommodated in the battery case 110. Each of the lithium resupply electrode leads 133 and 134 may have one side disposed in the battery case 110 and the other side protruding to the outside of the battery case 110.

In the discharging step, the electrode 123 may be discharged before the lithium resupply step. Here, in the discharging step, a maximum amount of lithium ions of the negative electrode 122 may move to the positive electrode 121 to maximally discharge the negative electrode 122. That is, a maximum amount of lithium ions existing in the negative electrode 122 may move to the positive electrode 121.

In the lithium resupply step, the lithium resupply electrode 130 may be further provided in the secondary battery 100. Here, the positive electrode 121 may be set as a counter electrode, and the lithium resupply electrode 130 may be set as a working electrode to charge the lithium ions to the positive electrode 121 through the lithium resupply electrode 130. Here, the working electrode may be an electrode for supplying the lithium ions, and the counter electrode may be an electrode for receiving the lithium ions.

In the lithium resupply step, the positive electrode 121 and the negative electrode 122 are electrically disconnected to each other, and the lithium resupply electrode 130 and the negative electrode 122 are electrically connected to each other. That is, when the lithium secondary battery 100 is used in electronic equipment or the like, the lithium resupply electrode 130 is electrically turned off, and the positive electrode 121 and the negative electrode 122 are maintained in the turn-on state. On the other hand, the lithium secondary battery 100 is recovered in capacity, the lithium resupply electrode 130 and the negative electrode 122 are electrically turned on therebetween, and the positive electrode 121 is set to the turn-off state. Here, the electrical connection between the positive electrode lead 125 connected to the positive electrode 121, the negative electrode lead 126 connected to the negative electrode 122, and the lithium resupply electrode leads 133 and 134 connected to the lithium resupply electrode 130 may be individually turned on/off to selectively turn on/off the electrical connection between the positive electrode 121, the negative electrode 122, and the lithium resupply electrode 130.

In the lithium resupply step, for example, one lithium resupply electrode of the plurality of lithium resupply electrodes 130 may be set as the working electrode to charge the lithium ions to the positive electrode 121. Then, when a charging rate of the positive electrode 121 reaches 40% to 60%, the other lithium resupply electrode instead of the one lithium resupply electrode may be set as the working electrode to completely charge the lithium ions to the positive electrode 121.

Here, in the lithium resupply step, in more detail, the first lithium resupply electrode 131 disposed in one direction of the electrode assembly 120 may be set as the working electrode to charge the lithium ions to the positive electrode 121. Then, when a charging rate of the positive electrode 121 reaches 50%, the second lithium resupply electrode 132 instead of the first lithium resupply electrode 131 may be set as the working electrode to completely charge the lithium ions to the positive electrode 121.

Thus, all of the first lithium resupply electrode 131 and the second lithium resupply electrode 132, which are disposed at both sides of the electrode assembly 120, may be used to supply the lithium ions to the positive electrode 121 so that the lithium ions are uniformly supplied to the positive electrode 121. That is, when the lithium source is supplied to only one side of the positive electrode 121, the lithium source may be supplied to be biased to the one side. However, when the lithium source is supplied to both sides of the positive electrode 121, the lithium source may be more uniformly supplied.

In the negative electrode discharging step, after the lithium ions are resupplied to the positive electrode 121 through the lithium resupply step, the lithium resupply electrode 130 is set as the counter electrode, and the negative electrode 122 is set as the working electrode to completely discharge the negative electrode 122 up to a discharge limit. That is, the lithium ions remaining in the negative electrode 122 move to the lithium resupply electrode 130. Thus, the lithium ions remaining in the negative electrode 122 because all of the lithium ions do not move from the negative electrode 122 to the positive electrode 121 may move to the lithium resupply electrode 130. As a result, the lithium ions remaining in the negative electrode 122 may be completely removed, and then, new lithium ions may be supplied.

Here, the lithium resupply step and the negative electrode discharging step may be repeated to increase in electrode capacity, and also, new lithium ions may be supplied.

In the negative electrode discharging step, one lithium resupply electrode of the plurality of lithium resupply electrodes 130 may be set as the counter electrode to discharge the negative electrode 122. Then, when a discharging rate of the negative electrode 122 reaches 40% to 60%, the other lithium resupply electrode instead of the one lithium resupply electrode may be set as the counter electrode to completely discharge the negative electrode 122.

Here, in the negative electrode discharging step, in more detail, the first lithium resupply electrode 131 disposed in one direction of the electrode assembly 120 may be set as the counter electrode so that the lithium ions move from the negative electrode 122 to the first lithium resupply electrode 131 to discharge the negative electrode 122. Then, when a discharging rate of the negative electrode 122 reaches 50%, the second lithium resupply electrode 132 instead of the first lithium resupply electrode 131 may be set as the counter electrode to completely discharge the lithium ions from the negative electrode 122.

In the method for regenerating the lithium secondary battery according to an embodiment of the present invention, the negative electrode discharging step may further comprise a pulse applying step of applying a high current pulse to the negative electrode 122 to remove an inorganic salt layer and an organic salt layer, which are laminated on the negative electrode 122.

In more detail, in the negative electrode discharging step, since the negative electrode 122 is thickened as the secondary battery 100 is repeatedly used, a strong high-current pulse may be applied to the negative electrode 122 to increase in moving rate of the lithium ions, thereby separating the inorganic salt layer and the organic salt layer from the negative electrode 122.

That is, an inorganic salt and an organic salt, which are lithium salts contained in the electrolyte, are laminated on an outer surface of the negative electrode 122 to form a layer as the charging/discharging are repeated. If the inorganic salt layer and the organic salt layer block the movement of the lithium ions provided in a negative electrode active material at the negative electrode 122, when the strong high-current pulse is applied to the negative electrode 122 to increase in moving rate of the lithium ions, the inorganic salt layer and the organic salt layer covering the outer surface of the negative electrode active material may be pushed out by the lithium ions and thus be separated from the negative electrode 122.

Here, since an intensity of a pulse of current is proportional to the moving rate of the lithium ions, the moving rate of the lithium ions may increase as the intensity of the pulse of the current increases, and thus, the strong high-current pulse may be applied to remove the inorganic salt layer and the organic salt layer, which are thickened and remain in the negative electrode 122.

Also, in the pulse applying step, for example, a current pulse of 1.0 C to 2.5 C may be applied to the negative electrode 122. Here, when a current pulse of 1.0 C or less is applied to the negative electrode 122, the lithium ions may decrease in moving rate, and thus, the effect of removing the inorganic salt layer and the organic salt layer may be reduced.

Also, when a current pulse of 2.5 C or more is applied to the negative electrode 122, the negative electrode active material may be damaged or broken due to the excessive high-current. Furthermore, when the current pulse of 2.5 C or more is applied to the negative electrode 122, a solid electrolyte interface layer formed on the surface of the negative electrode 122 may be broken due to the excessive high-current, and also, the lithium ions may become dead lithium ions and be grown as dendrite to increase in resistance. Here, the continuously grown dendrite may damage the separator 124, and thus, the positive electrode 121 and the negative electrode 122 may be short-circuited to cause a risk of ignition and explosion.

In more detail, for example, when a current pulse of 2.5 C (if the battery capacity is 50 Ah, and current of 2.5 C is applied, current that satisfies following equation: 50*2.5=125 A flows) may be applied to the negative electrode 122.

Also, in the pulse applying step of the negative electrode discharging step, when one lithium resupply electrode 130 of the plurality of lithium resupply electrodes 130 is set as the counter electrode to discharge the negative electrode 122, the pulse applying step may be performed. Also, when a discharging rate of the negative electrode 122 reaches 40% to 60%, the other lithium resupply electrode 130 instead of the one lithium resupply electrode 130 may be set as the counter electrode to perform the pulse applying step, thereby completely discharging the negative electrode 122. Thus, in the pulse applying step, the lithium ions moving as the strong current may move to the positive electrode 121 to damage or break the positive electrode active material, thereby causing collapse of the positive electrode structure.

In the determination step, the lithium resupply electrode 130 may be set as the working electrode, and the positive electrode 121 and the negative electrode 122 may be set as the counter electrodes to detect a voltage value and a charging capacity of each of the positive electrode 121 and the negative electrode 122 with respect to the lithium resupply electrode 130, thereby determining a degree of degradation of each of the positive electrode 121 and the negative electrode 122.

Here, when a voltage value and a charging capacity are measured through each of the positive electrode 121 and the negative electrode 122, the voltage value and the charging rate of each of the positive electrode 121 and the negative electrode 122 can not be measured. Here, only one voltage value and charging rate may be obtained because the positive electrode 121 and the negative electrode 122 are electrically connected to each other.

However, when the lithium resupply electrode 130 is set as a reference electrode, the lithium resupply electrode 130 and the positive electrode 121 may be connected to each other, and the lithium resupply electrode 130 and the negative electrode 122 may be individually connected to individually measure the voltage value and the charging rate of each of the positive electrode 121 and the negative electrode 122. As a result, a degree of degradation of each of the positive electrode 121 and the negative electrode 122 may be individually accurately determined through the lithium resupply electrode 130.

Figure 6:
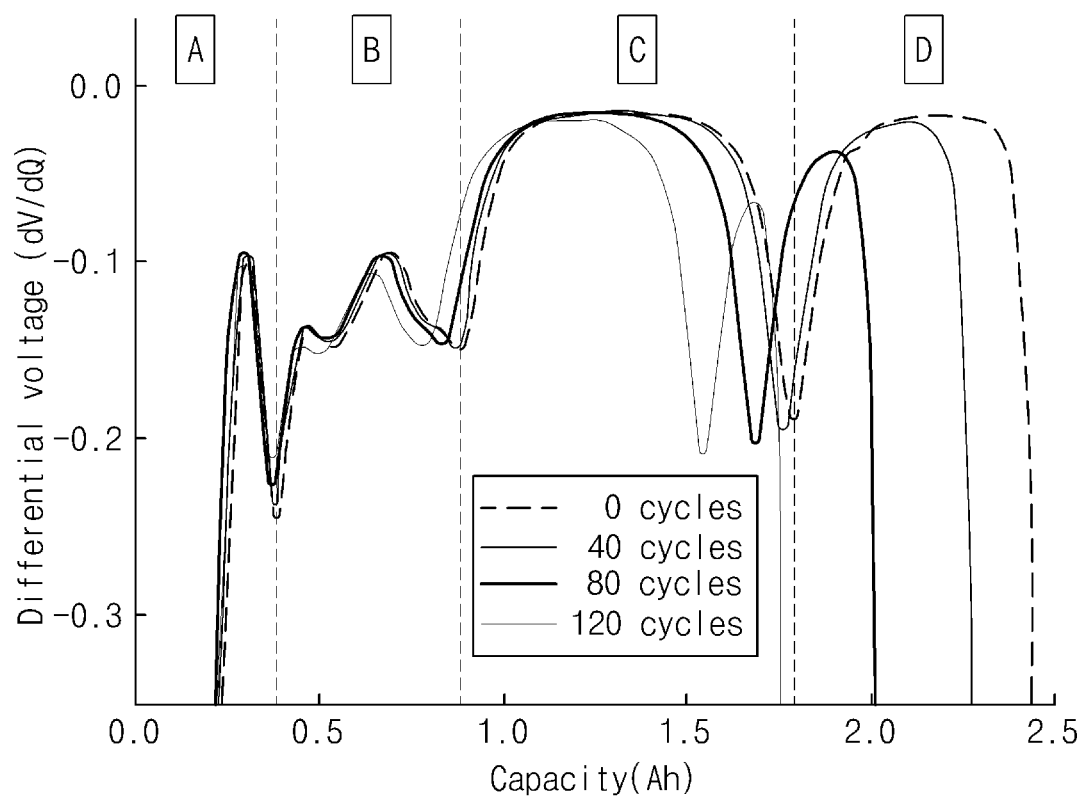
FIG. 6 is a graph illustrating differential voltage data that is used in a determination step in the method for regenerating the lithium secondary battery according to an embodiment of the present invention.

FIG. 6 is a graph illustrating differential voltage data that is used in the determination step in the method for regenerating the lithium secondary battery according to an embodiment of the present invention.

In the graph of FIG. 6, an X axis may represent a charging capacity, and a Y axis may represent a differential voltage dV/dQ. Here, the differential voltage of the Y axis represents a differential value dV of the voltage of the negative electrode divided by the negative value dQ of the charging capacity of the negative electrode. Also, the graph of FIG. 6 may be divided into sections A, B, C, and D according to the charging capacity.

In FIG. 6, the sections B and C may be shifted to a right side on the graph of FIG. 6 when the active material is degraded, and the section D may be shifted to the light side when an amount of lithium ions that are available in the lithium secondary battery is reduced.

Thus, the degree of degradation of the active material and the amount of available lithium ions may be checked through the graph shown in FIG. 6 to accurately determine degradation tendency of the secondary battery.

Like the differential voltage graph of the negative electrode, which is shown in FIG. 6, a differential voltage graph of the positive electrode may be shown. As a result, since the data of the negative electrode and the data of the positive electrode are separately measured, the degree of degradation of each of the positive electrode and the negative electrode may be individually determined.

Particularly, the differential voltage graphs of the positive electrode and the negative electrode may be monitored in real time to supply the lithium ions at the required time.

Referring to FIGS. 3 to 5, in the balance reestablishment step, the degree of degradation of each of the positive electrode 121 and the negative electrode 122 may be determined through the determination step, and the amount of lithium ions to be supplied to the positive electrode 121 and the discharging rate of the negative electrode 122 may be adjusted through the lithium resupply step and the negative electrode discharging step to reestablish the balance of the electrode 123.

In detail, when it is determined that the degree of degradation of the positive electrode 121 is greater than that of the negative electrode 122 through the determination step, the amount of lithium ions to be supplied may increase through the lithium resupply step to adjust the capacities of the positive electrode 121 and the negative electrode 122 to correspond to each other.

When it is determined that the degree of degradation of the negative electrode 122 is greater than that of the positive electrode 121 through the determination step, the discharging rate of lithium ions may increase through the discharging step to adjust the capacities of the positive electrode 121 and the negative electrode 122 to correspond to each other.

That is, when the lithium ions move between the positive electrode 121 and the negative electrode 122 to perform the charging/discharging, one electrode 123 of the positive electrode 121 and the negative electrode 122 may be limited in capacity to solve limitation in capacity of the other electrode 123. As a result, the secondary battery may more effectively increase in capacity.

Figure 7:
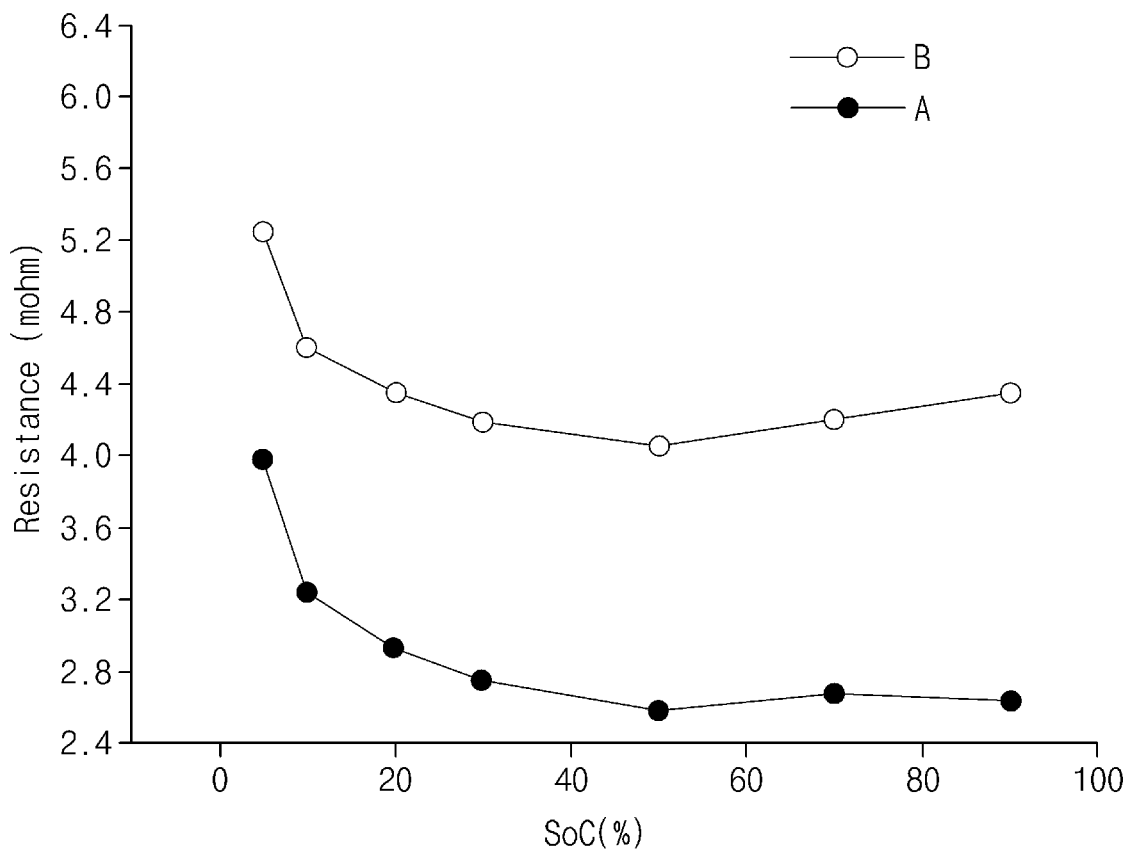
FIG. 7 is a graph illustrating a variation in resistance of a lithium secondary battery that is regenerated through the method for regenerating the lithium secondary battery according to an embodiment of the present invention.

FIG. 7 is a graph illustrating a variation in resistance of the lithium secondary battery that is regenerated through the method for regenerating the lithium secondary battery according to an embodiment of the present invention.

The graph of FIG. 7 represents a variation in resistance of a lithium secondary battery A that is regenerated through the method for regenerating the lithium secondary battery according to an embodiment of the present invention and a lithium secondary battery B before the regeneration. Here, in the graph, a horizontal axis represents a state of charge (SOC), and a vertical axis represents resistance. Also, in the graph of FIG. 7, a resistance value when electricity of 1.5 C is applied to the lithium secondary battery so that current of 98.7 A flows through the lithium secondary battery is detected. Here, electricity may be applied for 10 seconds in each section of the SOC to detect a resistance value for each section.

Referring to the graph of FIG. 7, it is seen that the resistance of the lithium secondary battery A that is regenerated through the method for regenerating the lithium secondary battery according to an embodiment of the present invention is relatively reduced when compared to the resistance of the lithium secondary battery B before the regeneration. As a result, it is seen that the lithium secondary battery A that is regenerated through the method for regenerating the lithium secondary battery according to an embodiment of the present invention is improved in performance.

Hereinafter, a method for regenerating a lithium secondary battery according to another embodiment of the present invention will be described with reference to FIGS. 1 to 5.

Referring to FIGS. 1 to 5, the method for regenerating the lithium secondary battery according to another embodiment of the present invention is different from the method for regenerating the lithium secondary battery according to the forgoing embodiment in a determination method of a determination step. Thus, contents of this embodiment, which are duplicated with those according to the forgoing embodiment, will be briefly described, and also, differences therebetween will be mainly described.

According to the determination method in the method for regenerating the lithium secondary battery according to another embodiment of the present invention, with respect to a lithium resupply electrode 130, a predetermined current pulse may be applied to a positive electrode 121 and a negative electrode 122 for a predetermined time to detect a resistance value of each of the positive electrode 121 and the negative electrode 122 through a value of the applied current and a variation in voltage, thereby determining a degree of degradation of each of the positive electrode 121 and the negative electrode 122 in a manner in which it is determined that the degree of degradation increases when the resistance value increases.

Here, in the determination method, for example, when a current pulse of 1 C (if the battery capacity is 50 Ah, and current of 1 C is applied, current that satisfies following equation: 50*1=50 A flows) may be applied to the positive electrode 121 and the negative electrode 122 for 10 seconds to detect a resistance value of each of the positive electrode 121 and the negative electrode 122 through the value of the applied current and the variation in voltage.

In a balance reestablishment step of the method for regenerating the lithium secondary battery according to another embodiment of the present invention, an amount of lithium ions to be supplied to the positive electrode 121 and a discharging rate of the negative electrode 122 may be adjusted through a lithium resupply step and a negative electrode discharging step according to the degree of degradation of each of the positive electrode 121 and the negative electrode 122 through the determination step to reestablish a balance between the positive electrode 121 and the negative electrode 122.

While the present invention has been particularly shown and described with reference to exemplary embodiments thereof, the method for regenerating the lithium secondary battery according to the present invention is not limited thereto. It will be understood by those of ordinary skill in the art that various changes in form and details may be made therein without departing from the spirit and scope of the invention.

Furthermore, the scope of protection of the present invention will be clarified by the appended claims.

The invention claimed is:

1. A method for regenerating a lithium secondary battery comprising an electrode assembly, in which a positive electrode and a negative electrode are alternately combined with a separator and laminated, and a battery case comprising an accommodation part accommodating the electrode assembly, the method comprising:
a lithium resupply step in which a lithium resupply electrode is further provided in the secondary battery, and the positive electrode is set as a counter electrode, and the lithium resupply electrode is set as a working electrode to charge lithium ions to the positive electrode through the lithium resupply electrode;
a negative electrode discharging step in which, after the lithium ions are resupplied to the positive electrode through the lithium resupply step, the lithium resupply electrode is set as the counter electrode, and the negative electrode is set as the working electrode to completely discharge the negative electrode up to a discharge limit; and
recovering the secondary battery in capacity,
wherein, in the lithium resupply step, a plurality of lithium resupply electrodes are provided, wherein one of the plurality of the lithium resupply electrodes is set as the working electrode to charge the positive electrode, and
when a charging rate of the positive electrode reaches 40% to 60%, an other lithium resupply electrode instead of the one lithium resupply electrode is set as the working electrode to completely charge the lithium ions to the positive electrode.

2. The method of claim 1, further comprising, before the lithium resupply step, a discharging step of allowing the lithium ions to move from the negative electrode to the positive electrode, thereby discharging the electrode.

3. The method of claim 1, wherein the lithium resupply step and the negative electrode discharging step are repeatedly performed to recover the capacity of the secondary battery.

4. The method of claim 1, wherein, in the negative electrode discharging step, a plurality of lithium resupply electrodes are provided, wherein one of the plurality of the lithium resupply electrodes, is set as the counter electrode to discharge the negative electrode, and
when a discharging rate of the negative electrode reaches 40% to 60%, an other lithium resupply electrode instead of the one lithium resupply electrode is set as the counter electrode to completely discharge the negative electrode.

5. The method of claim 4, wherein the plurality of lithium resupply electrodes comprise a first lithium resupply electrode disposed at one side of the electrode assembly and a second lithium resupply electrode disposed at an other side of the electrode assembly.

6. The method of claim 4, wherein the negative electrode discharging step further comprises a pulse applying step of applying a high-current pulse to the negative electrode to remove an inorganic salt layer and an organic salt layer, which are formed on the negative electrode.

7. The method of claim 1, wherein the plurality of lithium resupply electrodes comprise a first lithium resupply electrode disposed at one side of the electrode assembly and a second lithium resupply electrode disposed at an other side of the electrode assembly.

8. The method of claim 1, wherein the negative electrode discharging step further comprises a pulse applying step of applying a high-current pulse to the negative electrode to remove an inorganic salt layer and an organic salt layer, which are formed on the negative electrode.

9. The method of claim 8, wherein, in the pulse applying step, a current pulse of 1.0 C to 2.5 C is applied to the negative electrode.

10. The method of claim 1, further comprising a determination step of determining a degree of degradation of each of the positive electrode and the negative electrode,
wherein one or more steps of the lithium resupply step and the negative electrode discharging step are performed only when the degree of degradation of each of the positive electrode and the negative electrode, which is determined through the determination step, is above a predetermined range.

11. The method of claim 10, further comprising a reestablishment step in which the degree of degradation of each of the positive electrode and the negative electrode is determined through the determination step to adjust an amount of lithium ions to be supplied to the positive electrode and a discharging rate of the negative electrode through the lithium resupply step and the negative electrode discharging step, thereby reestablishing a balance between the positive electrode and the negative electrode.

12. The method of claim 10, wherein, in the determination step, the lithium resupply electrode is set as a working electrode, and the positive electrode and the negative electrode are set as counter electrodes to detect a voltage value and a charging capacity of each of the positive electrode and the negative electrode with respect to the lithium resupply electrode, thereby determining the degree of degradation of each of the positive electrode and the negative electrode.

13. The method of claim 10, wherein, in the determination step, with respect to the lithium resupply electrode, a predetermined current pulse is applied to the positive electrode and the negative electrode for a predetermined time to detect a resistance value of each of the positive electrode and the negative electrode through a value of applied current and a variation in voltage, thereby determining the degree of degradation of each of the positive electrode and the negative electrode.

14. The method of any one of claim 1, wherein the lithium resupply electrode contains a lithium metal.

\* \* \* \* \*